(12) United States Patent
Kim et al.

(10) Patent No.: US 10,497,623 B2
(45) Date of Patent: Dec. 3, 2019

(54) METHOD OF MANUFACTURING A SEMICONDUCTOR PACKAGE INCLUDING A SHIELD LAYER

(71) Applicant: DISCO CORPORATION, Tokyo (JP)

(72) Inventors: Youngsuk Kim, Tokyo (JP); Byeongdeck Jang, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/958,847

(22) Filed: Apr. 20, 2018

(65) Prior Publication Data

US 2018/0308756 A1 Oct. 25, 2018

(30) Foreign Application Priority Data

Apr. 21, 2017 (JP) .................................. 2017-084105

(51) Int. Cl.
| H01L 21/78 | (2006.01) |
| H01L 21/56 | (2006.01) |
| H01L 23/31 | (2006.01) |
| H01L 21/683 | (2006.01) |
| H01L 23/00 | (2006.01) |

(52) U.S. Cl.
CPC ............ *H01L 21/78* (2013.01); *H01L 21/561* (2013.01); *H01L 21/565* (2013.01); *H01L 21/6836* (2013.01); *H01L 23/3128* (2013.01); *H01L 23/3135* (2013.01); *H01L 23/562* (2013.01); *H01L 2221/68331* (2013.01); *H01L 2224/48091* (2013.01); *H01L 2224/48227* (2013.01); *H01L 2224/97* (2013.01); *H01L 2924/15159* (2013.01); *H01L 2924/181* (2013.01)

(58) Field of Classification Search
CPC ... H01L 21/78; H01L 21/565; H01L 23/3135; H01L 23/3128; H01L 21/561; H01L 21/6836; H01L 23/562; H01L 2924/15159; H01L 2224/97; H01L 2224/48227; H01L 2924/181; H01L 2224/48091; H01L 2221/68331
See application file for complete search history.

(56) References Cited

U.S. PATENT DOCUMENTS

2015/0296667 A1* 10/2015 Hirose .................. H01L 21/568
427/126.2

FOREIGN PATENT DOCUMENTS

JP 2003347441 A 12/2003

* cited by examiner

*Primary Examiner* — Sonya D. McCall-Shepard
(74) *Attorney, Agent, or Firm* — Greer Burns & Crain Ltd.

(57) ABSTRACT

A semiconductor package has a semiconductor chip on a wiring board, sealed with a sealant. A semiconductor package substrate is formed with V grooves along division lines from a resin layer side by use of a V blade. The wiring board is divided along the V grooves into individual semiconductor packages, while forming an inclined surface and a vertical surface at each package side surface. A shield layer is formed on the package upper surface and the package side surfaces. In this instance, the aspect ratio at the vertical surface side of the package interval is controlled, whereby an appropriate shield layer is formed on the package upper surface and the package inclined surfaces, thereby securing a shielding effect, and the shield layer is formed in a thin form on the package vertical surfaces and on the groove bottom between the packages, thereby restraining generation of burs.

10 Claims, 12 Drawing Sheets

METHOD OF MANUFACTURING A SEMICONDUCTOR PACKAGE INCLUDING A SHIELD LAYER

BACKGROUND OF THE INVENTION

Field of the Invention

The present invention relates to a method of manufacturing a semiconductor package which has a shielding function.

Description of the Related Art

In general, a semiconductor package for use in a portable communication apparatus such as a mobile phone is required to restrain leakage of electromagnetic noises to the exterior, for preventing bad influences on communication characteristics. Therefore, it is necessary for the semiconductor package to have a shielding function. As a semiconductor package having a shielding function, there has been known one in which a semiconductor chip mounted on an interposer substrate is sealed with a sealant, and a shield layer is formed along an outer surface of the sealant layer. While the shield layer may be composed of a sheet metal shield, the considerable thickness of the sheet metal in this case hampers reductions in size and thickness of the apparatus. In view of this problem, there have been proposed techniques for forming a shield layer in a thin form by a sputtering method, a spray coating method, a chemical vapor deposition (CVD) method, an ink jet method, a screen printing method or the like (see, for example, Japanese Patent No. 3923368).

SUMMARY OF THE INVENTION

Meanwhile, when semiconductor packages after a dividing step are aligned and a shield layer is formed on the semiconductor packages from above by sputtering or the like, the shield layer is deposited (builds up) between the adjacent packages. Then, at the time of picking up the semiconductor package, large burs may be generated due to, for example, tearing-up of the shield layer between the packages, or division between the packages may not be achieved successfully. In such a case, it is necessary to separately remove the burs from the semiconductor package by a processing tool or the like. The deburring work needs a lot of time, and there may exist burs which cannot be completely removed from the semiconductor package even by use of a processing tool.

Accordingly, it is an object of the present invention to provide a method of manufacturing a semiconductor package by which generation of burs at the time of picking up the semiconductor package can be restrained.

In accordance with an aspect of the present invention, there is provided a method of manufacturing a semiconductor package, the semiconductor package obtained by dividing a semiconductor package substrate having a plurality of semiconductor chips which are mounted in a plurality of regions on a wiring board partitioned by a plurality of intersecting division lines and which are sealed with a sealant, the semiconductor package substrate being divided along the division lines. The method includes: an adhering step of adhering a wiring board side of the semiconductor package substrate onto a support member having an adhesive layer; a groove forming step of cutting in from a sealant side to at least an intermediate position in the sealant along the division lines by a processing tool, to form grooves having a first width at least at an upper surface of the sealant, after the adhering step is conducted; a dividing step of cutting in from the sealant side to an intermediate position in the support member along the grooves by use of a cutting blade having a second width smaller than the first width, to divide the semiconductor package substrate such that the adjacent semiconductor packages are spaced by a predetermined interval X mm from each other, after the groove forming step is conducted; a shield layer forming step of forming a shield layer on side surfaces of the semiconductor packages and an upper surface of the sealant from a conductive material supplied from above the sealant, after the dividing step is conducted; and a picking-up step of picking up the semiconductor package formed with the shield layer, after the shield layer forming step is conducted. The first width and the second width are so set that an inclination or a step is generated in each side surface in such a manner that outer shape size of the semiconductor package becomes larger than that at an upper surface of the sealant of each of the divided semiconductor packages on route from the upper surface toward the lower surface of the sealant, and where the side surface length from a lower end of the inclination or step of the semiconductor package to a groove bottom of the cut into the support member is Y mm, then the first width, the second width, the side surface length Y mm, and shield layer forming conditions are so set as to obtain such an aspect ratio Y/X that at the time of formation of the shield layer, the shield layer is formed on the side surfaces but the amount of the shield layer formed on the groove, bottom between the semiconductor packages is reduced.

In accordance with another aspect of the present invention, there is provided a method of manufacturing a semiconductor package, the semiconductor package obtained by dividing a semiconductor package substrate having a plurality of semiconductor chips which are mounted in a plurality of regions on a wiring board partitioned by a plurality of intersecting division lines and which are sealed with a sealant, the semiconductor package substrate being divided along the division lines. The method includes: a dividing step of dividing the semiconductor package substrate along the division lines, and forming each side surface of each semiconductor package with an inclination or step such that outer shape size of the semiconductor package becomes larger than that at an upper surface of the sealant of the semiconductor package on route from the upper surface toward a lower surface of the sealant; a semiconductor package aligning step of aligning the divided individual semiconductor packages in such a manner that the adjacent semiconductor packages are spaced by a predetermined interval X mm from each other, and holding a wiring board side of the aligned semiconductor packages on a holding jig or adhering the wiring board side onto a support member; a shield layer forming step of forming a shield layer on side surfaces of the semiconductor packages and an upper surface of the sealant from a conductive material supplied from above the sealant; and a picking-up step of picking up the semiconductor package formed with the shield layer, after the shield layer forming step is conducted. Where side surface length from a lower end of the inclination or step of the semiconductor package to the holding jig or the support member is Y mm, then the inclination or step, the side surface length Y mm, the predetermined interval X mm, and the shield layer forming conditions are so set as to obtain such an aspect ratio Y/X that at the time of formation of the shield layer, the shield layer is formed on the side surfaces but the amount of the shield layer formed on a bottom surface between the semiconductor packages is reduced.

According to these configurations, the side surface of the semiconductor package is formed with the inclination or step such that the outer shape size of the semiconductor package becomes larger than that at the upper surface of the sealant on route from the upper surface toward the lower surface of the sealant of the semiconductor package after the dividing. By this inclination or step, the side surface is divided into an upper portion and a lower portion. By control of the aspect ratio (vertical-to-horizontal ratio) Y/X, where X (mm) is the interval between the semiconductor packages adjacent to each other at the boundary position of the upper and lower portions of the side surface, and Y (mm) is the depth on the lower side of the side surface, it is ensured that the shield layer is less liable to be formed at the lower surface side of the semiconductor packages. The shield layer on the side surface of the semiconductor package and the shield layer on the groove bottom are separated from each other more easily, so that generation of burs upon picking-up of the semiconductor package can be restrained. Therefore, the need for a deburring work is eliminated, and, accordingly, processing quality and processing time can be improved.

In a method of manufacturing a semiconductor package in accordance with still another aspect of the present invention, in the semiconductor package aligning step, the semiconductor packages are placed in regions formed by partitioning a holding surface of the holding jig or the support member by grooves provided in a grid pattern, and are aligned such that the adjacent semiconductor packages are spaced by the predetermined interval X mm from each other, and the groove width of the grooves is larger than the predetermined interval X mm between the semiconductor packages.

According to the present, invention, by controlling the aspect ratio between the adjacent semiconductor packages, it is ensured that the shield layer is less liable to be formed on the groove bottom, and generation of burs upon picking-up of the semiconductor package can be restrained.

The above and other objects, features and advantages of the present invention and the manner of realizing them will become more apparent, and the invention itself will best be understood from a study of the following description and appended, claims with reference to the attached drawings showing some preferred embodiments of the invention.

DETAILED DESCRIPTION OF THE PREFERRED EMBODIMENTS

Figure 1:
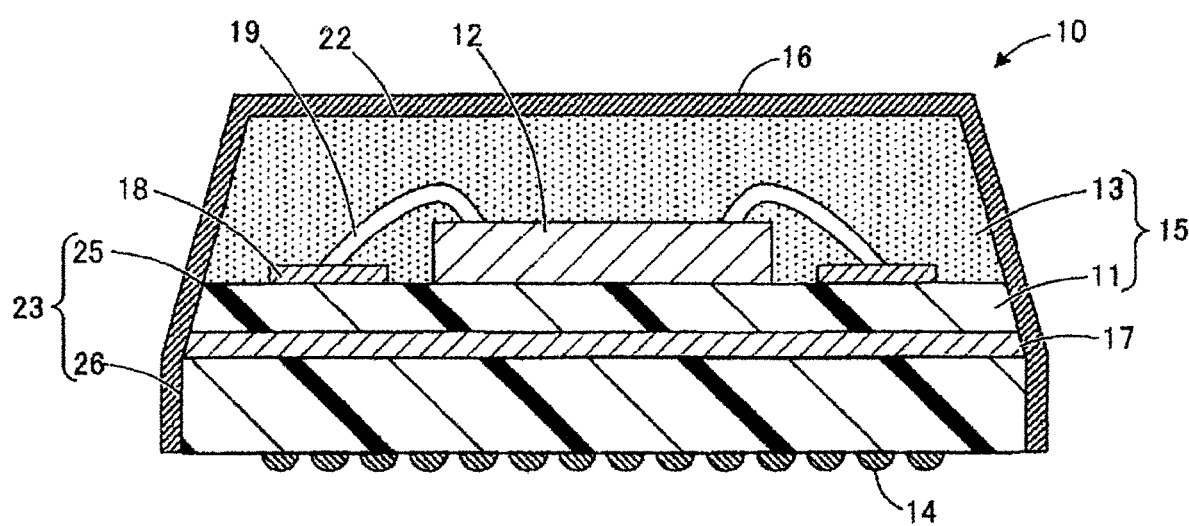
FIG. 1 is a sectional schematic view of a semiconductor package according to the present embodiment.
Figure 2A:
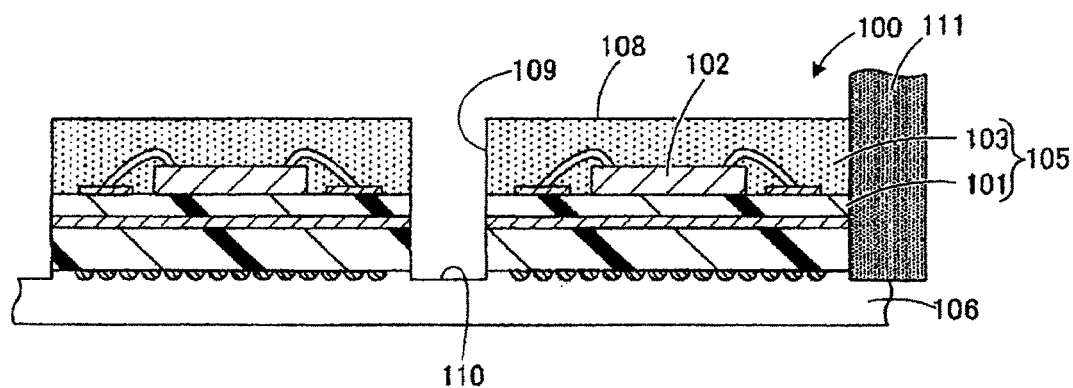
FIGS. 2A and 2B are schematic sectional views depicting a method of manufacturing a semiconductor package according to a comparative example.
Figure 2B:
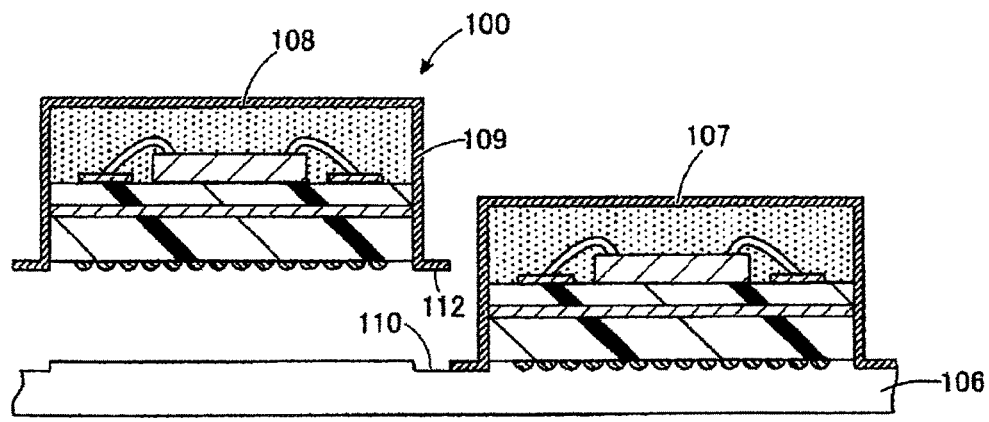

Referring to the attached drawings, a method of manufacturing a semiconductor package according to the present embodiment will be described below. FIG. 1 is a sectional schematic view of a semiconductor package according to the present embodiment. FIGS. 2A and 2B are figures for explaining a method of manufacturing a semiconductor package according to a comparative example. Note that the following embodiment is merely illustrative, and other step may be provided between the steps, and the order of the steps may be changed, as required.

As depicted in FIG. 1, a semiconductor package 10 is any packaged semiconductor apparatus that requires shielding in view of so-called electro-magnetic interference (EMI), and is configured such that leakage of electromagnetic noises to the surroundings is restrained by a shield layer 16 provided at an outer surface thereof. On the inside of the shield layer 16, semiconductor chips 12 mounted on an upper surface of a wiring board (interposer substrate) 11 are each sealed by a resin layer (sealant) 13, and bumps 14 are disposed on a lower surface of the wiring board 11. The wiring board 11 is formed with electrodes to foe connected to the semiconductor chips 12, and various wirings inclusive of a ground line 17.

The semiconductor chip 12 is formed by individualizing a semiconductor wafer on the basis of each device on a semiconductor substrate, and is mounted at a predetermined position on the wiring board 11. In addition, at each package side surface 23, an inclined surface 25 such as to expand outward in going downward from a package upper surface 22 is formed, and a shield layer 16 is formed on the inclined surface 25 from above by a sputtering method or the like. Thus, unlike vertical package side surfaces of a general semiconductor package, the inclined surfaces 25 of the package side surfaces 23 intersect obliquely the forming direction of the shield layer 16, so that it is easy to form the shield layer 16 on the inclined surface 25.

Meanwhile, as illustrated in FIG. 2A, a semiconductor package 100 according to a comparative example is formed by a method in which a semiconductor package substrate 105 with semiconductor chips 102 on a wiring board 101 being sealed by a resin layer 103 is fully cut by use of a cutting blade 111. The semiconductor packages 100 after division are aligned on a tape 106, and a shield layer 107 (see FIG. 2B) is formed thereon from above by sputtering or the like. In this case, since package side surfaces 109 are orthogonal to a package upper surface 108, the shield layer 107 with an appropriate thickness cannot be formed unless a sufficient package interval is secured. For this reason, there has been a problem, that the time required for forming the shield layer 107 is prolonged, and materials cost and equipment cost are raised.

As depicted in FIG. 2B, when the semiconductor package 100 is picked up from the tape 106 after the formation of the shield layer 107, the shield layer 107 deposited also in a thick form on a groove bottom 110 between the packages is peeled from the tape 106 together with the semiconductor package 100. The picking-up of the semiconductor package 100 may tear up the shield layer 107 between the packages, leaving a bur 112 at the lower side of a package side surface 109, or the shield layer 107 may not be cut between the packages. As a result, the yield of the semiconductor package 100 may be lowered, or a deburring work may be further needed and a lot of time may be required therefor.

Here, as a result of the present inventors' investigation of the relation between the thickness of the shield layer and the aspect ratio between the packages, it was found that at the lower side of the package side surface where bur is liable to be generated, the thickness of the shield layer is greatly affected by the aspect ratio between the packages. In view of this, in the present embodiment, at the upper side of the package side surface, the side surface is inclined or the package interval is enlarged to thereby form a shield layer in an appropriate thickness, and, at the lower side of the package side surface, the package interval is reduced (the aspect ratio is raised) to thereby reduce the thickness of the shield layer. With the shield layer thinned at the lower side of the package side surface, generation of bur at a package lower portion can be restrained.

Figure 3A:
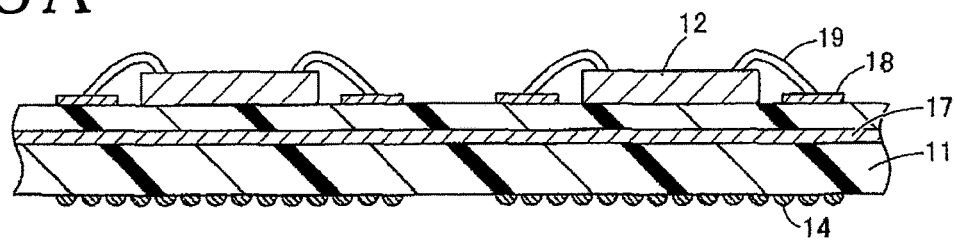
FIGS. 3A to 3D are schematic sectional views depicting a method of manufacturing a semiconductor package according to a first embodiment.
Figure 3B:
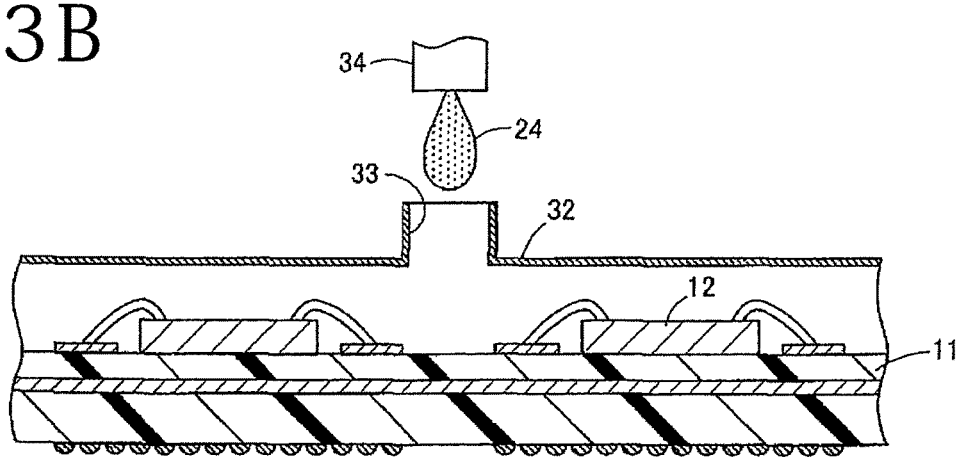
Figure 3C:
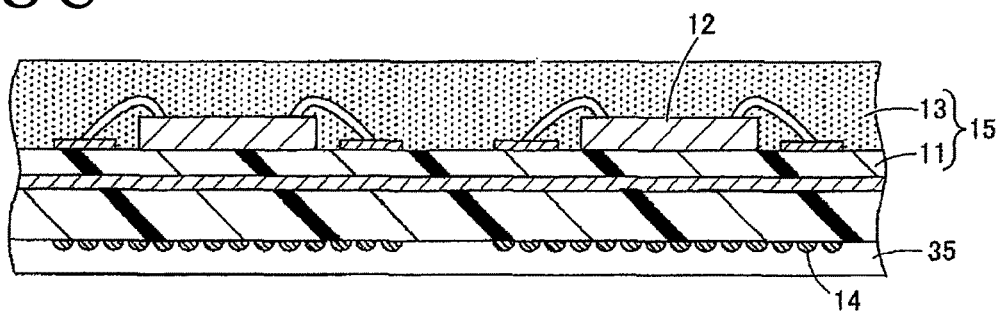
Figure 3D:
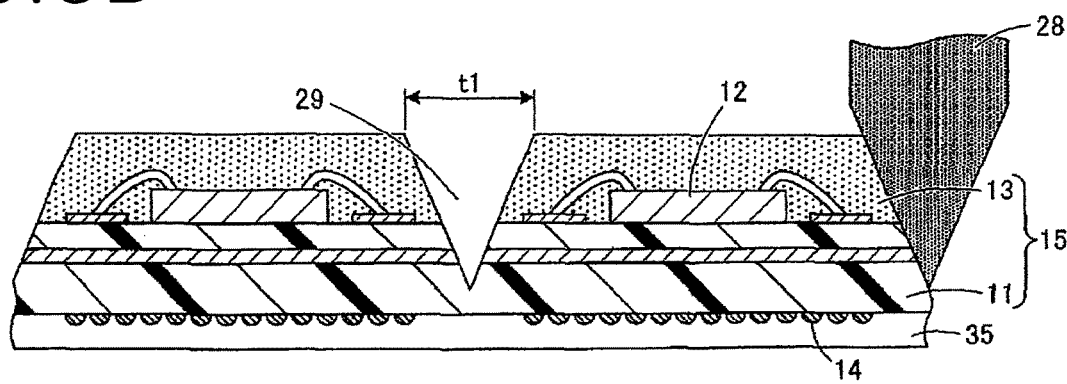
Figure 4A:
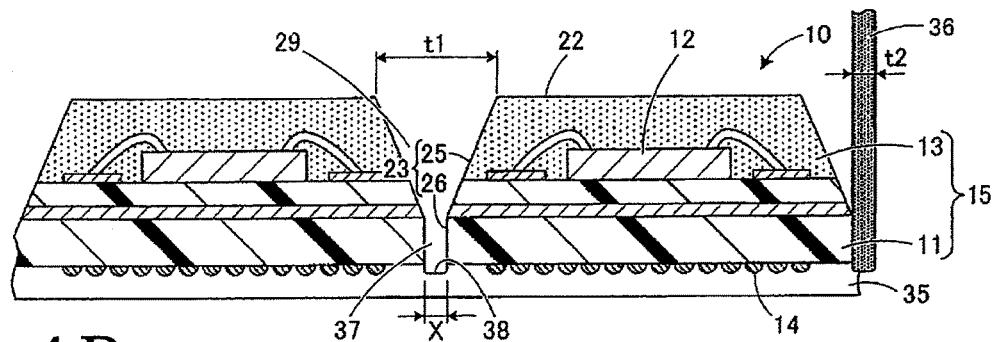
FIGS. 4A to 4D are schematic sectional views depicting the method of manufacturing a semiconductor package according to the first embodiment.
Figure 4B:
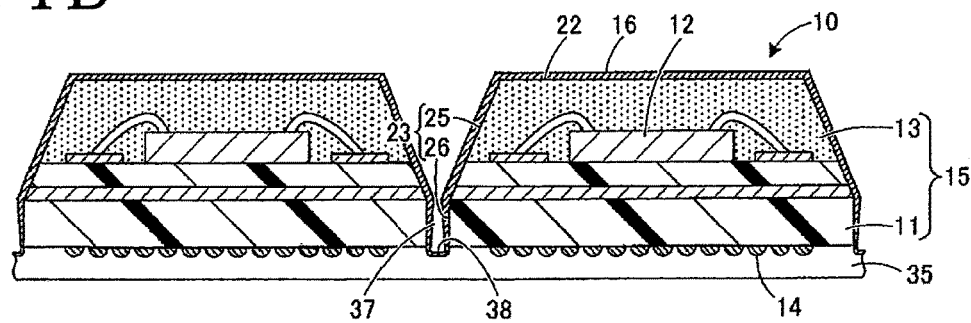
Figure 4C:
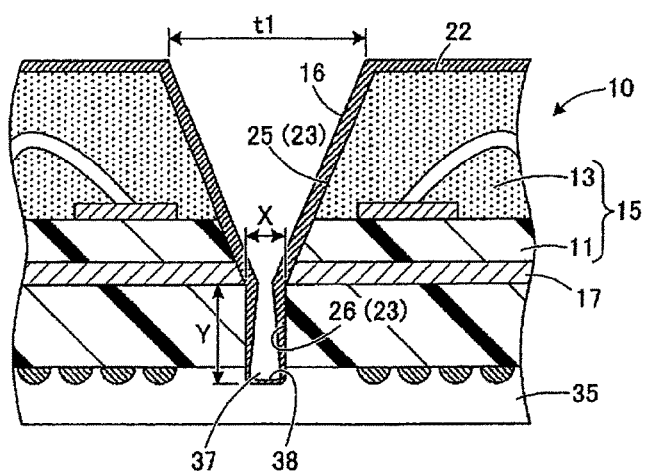
Figure 4D:
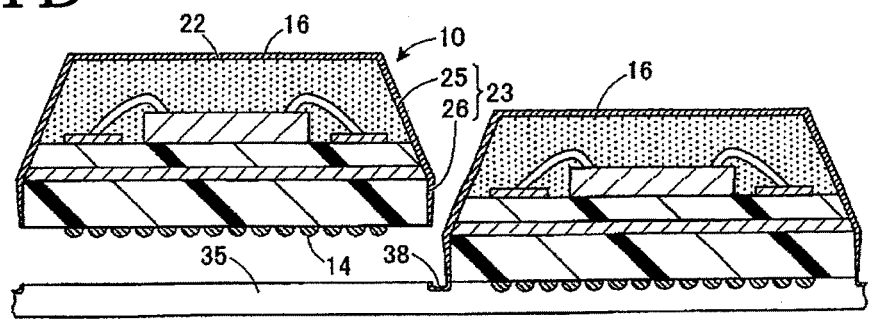

Referring to FIGS. 3A to 4D, a method of manufacturing a semiconductor package according to a first embodiment will be described below. FIGS. 3A to 4D are figures for explaining the method of manufacturing a semiconductor package according to the first embodiment. Note that FIG. 3A depicts an example of a mounting step, FIG. 3B depicts an example of a substrate producing step, FIG. 3C depicts an example of an adhering step, and FIG. 3D depicts an example of a groove forming step. In addition, FIG. 4A depicts an example of a dividing step, FIGS. 4B and 4C depict an example of a shield layer forming step, and FIG. 4D depicts an example of a picking-up step.

As depicted in FIG. 3A, a mounting step is first conducted. In the mounting step, a plurality of semiconductor chips 12 are mounted in a plurality of regions partitioned in a grid pattern by intersecting division lines on a surface of a wiring board 11. The wiring board 11 is formed therein with wirings such as a ground line 17, and bumps 14 are disposed on a lower surface of the wiring board 11. In this case, one end of a wire 19 is connected to an electrode on the upper surface of the semiconductor chip 12, and the other end of the wire 19 is connected to an electrode 18 on the surface of the wiring board 11. Note that the wire bonding is not limitative, and flip chip bonding may be performed in which electrodes on the lower surface of the semiconductor chip 12 are directly connected to electrodes on the surface of the wiring board 11.

As depicted in FIG. 3B, a substrate producing step is performed after the mounting step is conducted. In the substrate producing step, a sealant 24 is supplied to a front surface side of the wiring board 11 having the plurality of semiconductor chips 12 mounted thereon, and the semiconductor chips 12 are each sealed with the sealant 24, whereby a semiconductor package substrate 15 (see FIG. 3C) is produced. In this case, the lower surface of the wiring board 11 with the semiconductor chips 12 mounted thereon is held by a holding jig (not depicted), and a mold 32 is disposed so as to cover the upper surface of the wiring board 11. An upper wall of the mold 32 has an injection port 33 opened therein, and a supply nozzle 34 for supplying the sealant 24 is positioned on the upper side of the injection port 33.

Then, the sealant 24 is supplied onto the upper surface of the wiring board 11 from the supply nozzle 34 through the injection port 33, to seal the semiconductor chips 12. In this state, the sealant 24 is cured by heating or drying, whereby the semiconductor package substrate 15 having a resin layer 13 (see FIG. 3C) formed on the upper surface of the wiring board 11 is produced. Note that as the sealant 24, one that has a curing property is used; for example, the sealant 24 can be selected from among epoxy resins, silicone resins, urethane resins, unsaturated polyester resins, acrylic urethane resins, poly inside resins and the like. Besides, the sealant 24 is not limited to a liquid one, and a sheet-shaped or powdery resin can also be used. In this way, the plurality of semiconductor chips 12 on the wiring board 11 are sealed all together.

Note that the front surface of the semiconductor package substrate 15 (the resin layer 13 (see FIG. 3G)) may be planarized by grinding, after the substrate producing step. With the semiconductor package substrate 15 ground, by a grinding apparatus (not depicted), the resin layer 13 covering the semiconductor chips 12 can be adjusted to a desired thickness. In this way, a planarizing step may be performed after the substrate producing step. In addition, in the case where the semiconductor package substrate 15 is preliminarily prepared, the mounting step and the substrate producing step may be omitted.

As depicted in FIG. 3C, an adhering step is performed after the substrate producing step is conducted. In the adhering step, an adhesive tape 35 is adhered such as to close a central opening of a ring frame (not depicted) as a support member having an adhesive layer, and the wiring board 11 side of the semiconductor package substrate 15 is adhered onto the adhesive tape 35. In this case, the bumps 14 of the semiconductor package substrate 15 come into the adhesive layer of the adhesive tape 35, whereby the semiconductor package substrate 15 is favorably supported by the ring frame through the adhesive tape 35. Note that in the adhering step, a ring frame which is circular in top plan view may be used, or a ring frame which is tetragonal in top plan view may be used.

As depicted in FIG. 3D, a groove forming step is performed after the adhering step is conducted. In the groove forming step, the wiring board 11 side of the semiconductor package substrate 15 is held by a chuck table (not depicted) through the adhesive tape 35. A V blade 28 (processing tool) having a tip formed in a V shape is made to cut into the wiring board 11 (semiconductor package substrate 15) from the resin layer (sealant) 13 side to an intermediate position of the thickness of the wiring board 11 (semiconductor package substrate 15), whereby a V groove 29 is formed along each region corresponding to the division line. The V blade 28 is formed by binding diamond abrasive grains or the like with a binder into a disk shape with a V-shaped tip, and is mounted to a tip of a spindle (not depicted).

In this case, the V blade 28 is aligned to the division line on the outside of the semiconductor package substrate 15, and is lowered to a depth corresponding to an intermediate position of the thickness of the wiring board 11 on the outside of the semiconductor package substrate 15. Then, the semiconductor package substrate 15 is put into cutting feeding in a horizontal direction in relation to the V blade 28, whereby the semiconductor package substrate 15 is half cut along the division line, and the V groove 29 having a first width t1 is formed at least at the upper surface of the resin layer 13. This half cutting is repeated, whereby a plurality of V grooves 29 are formed in the upper surface of the semiconductor package substrate 15 along the division lines.

Figure 13:
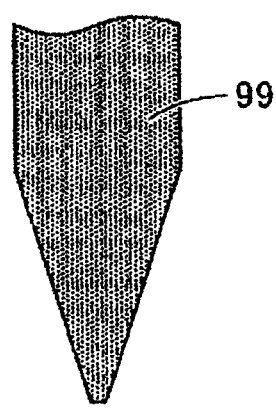
FIG. 13 is a sectional view depicting a modification of a catting blade.

Note that while the tip of the V blade 28 is formed in a V shape in the present embodiment, this configuration is not limitative. The tip of the V blade 28 need only be in such a shape that the V groove 29 can be thereby formed in the semiconductor package substrate 15. For example, as depicted in FIG. 13, the tip of a cutting blade 99 may be formed in a V shape with a flat tip. Therefore, the V shape of the tip of the cutting blade is not limited to a perfect V shape in which the cutting blade is pointed to the tip thereof, but includes a shape in which the tip of the cutting blade is in a substantially V shape with a flat tip. In addition, the V-shaped surface of the tip of the V blade may not necessarily be inclined rectilinearly, but may be somewhat rounded.

As depicted in FIG. 4A, a dividing step is performed after the groove forming step is conducted. In the dividing step, a cutting blade 36 having a second width t2 smaller than the first width t1 is used; the cutting blade 36 is made to cut in from the resin layer 13 side to an intermediate position of the thickness of the adhesive tape 35 along the V grooves 29, whereby the semiconductor package substrate 15 is divided into individual semiconductor packages 10. The cutting blade 36 is formed by binding diamond abrasive grains or the like with a binder into a disk shape with a rectangle-shaped tip, and is mounted to a tip of a spindle (not depicted). With the tip of the cutting blade 36 being rectangular in shape, a vertical rectangular groove 37 is formed from the groove bottom of the V groove 29 toward the adhesive tape 35.

In this case, the cutting blade 36 is aligned to the division line on the outside of the semiconductor package substrate 15, and the cutting blade 36 is lowered to a depth corresponding to an intermediate position of the thickness of the adhesive tape 35, on the outside of the semiconductor package substrate 15. Then, the semiconductor package substrate 15 is put into cutting feeding in a horizontal direction in relation to the cutting blade 36, whereby the semiconductor package substrate 15 is fully cut along the division line, and the adjacent semiconductor packages 10 are divided from each other in the manner of being spaced from each other by a predetermined interval of X mm. The full cutting is repeated, whereby the semiconductor package substrate 15 is individualized along the division lines.

In addition, since the second width t2 of the cutting blade 36 is smaller than the first width t1 of the V groove 29, the package side surface 23 is formed with the inclined surface 25 such that the outer shape size of package becomes larger than that at the package upper surface (sealant upper surface) 22 on route from, the package upper surface 22 toward a lower surface. In regard of the package side surface 23, the package interval is wider on the inclined surface 25 side and is narrower on the side of a vertical surface 26. While the details will be described later, with the package interval narrowed at the lower side (the vertical surface 26 side) of the package side surface 23, the aspect ratio is raised, and it is ensured that the shield layer 16 (see FIG. 4B) is less liable to be deposited (to build up) on a groove bottom 38 between the packages.

As depicted in FIG. 4B, a shield layer forming step is performed after the dividing step is conducted. In the shield layer forming step, the shield layer 16 is formed on the package upper surface 22 and the package side surfaces 23 from a conductive material supplied from above the resin layer 13. In this case, each semiconductor package 10 is held by a holding jig (not depicted) through the adhesive tape 35. Then, under predetermined shield layer forming conditions, a film of the conductive material is formed on the semiconductor packages 10 from above by sputtering or the like, whereby the shield layer 16 having a desired thickness is formed on the package upper surfaces 22 and the package side surfaces 23.

In this instance, the inclined surface 25 of the package side surface 23 is inclined in such a manner as to expand outward in going downward from the package upper surface 22, and the inclined surface 25 intersects obliquely the forming direction (vertical direction) of the shield layer 16. Therefore, when the shield layer 16 is formed on the semiconductor package 10, the shield, layer 16 is formed in a thickness large enough to display a sufficient shielding effect, not only on the package upper surface 22 but also on the inclined surfaces 25. Although the shield layer 16 is formed also on the vertical surfaces 26 of the package side surfaces 23 and on the groove bottom 38 between the packages, the thickness of the shield layer 16 there is controlled according to the aspect ratio between the packages (the aspect ratio of the rectangular groove 37).

More specifically, as depicted in FIG. 4C, the aspect ratio between the packages is represented by Y/X, where Y (mm) is the depth from the lower end of the inclined surface 25 to the groove bottom 38 of the cut into the adhesive tape 35 (the length of the side surface), and X (mm) is the opposing spacing between the vertical surfaces 26. The first width t1, the second width t2 (see FIG. 4A), the depth Y mm, and the shield layer forming conditions are so set as to obtain such an aspect ratio that at the time of formation of the shield layer, the shield layer 16 is formed on the package side surfaces 23 but the thickness of the shield layer 16 formed on the groove bottom 38 between the packages is reduced. Note that for each of these conditions, experimentally, empirically or theoretically obtained values are set.

The inclined surfaces 25 of the package side surfaces 23 and the upper side of the vertical surfaces 26 are less liable to be influenced by the aspect ratio, whereas the lower side of the vertical surfaces 26 of the package side surfaces 23 and the groove bottom 38 between the packages are more liable to be influenced by the aspect ratio. Therefore, the shield layer 16 can be formed in an appropriate thickness, irrespectively of the aspect ratio, on the inclined surfaces 25 and at the upper side of the vertical surfaces 26. On the other hand, at the lower side of the vertical surfaces 26 and on the groove bottom 38, the thickness of the shield layer 16 is varied, according to the aspect ratio between the packages. When the aspect ratio is high, the thickness of the shield layer 16 at the lower side of the vertical surfaces 26 and on the groove bottom 38 will be small, whereas when the aspect ratio is low, the thickness of the shield layer 16 at the lower side of the vertical surfaces 26 and on the groove bottom 38 will be large.

The control of the aspect ratio is carried out mainly by varying the depth Y mm from the lower end of the inclined surface 25 to the groove bottom 38, since the opposing spacing X mm between the vertical surfaces 26 is dependent on the line width of the division line. With the aspect ratio set to be high on the vertical surface 26 side, it is ensured that the shield layer 16 is formed in an appropriate thickness on the inclined surfaces 25 and at the upper side of the vertical surfaces 26 where the influence of the aspect ratio is slight, whereas the shield layer 16 is formed in a thin form at the lower side of the vertical surfaces 26 and on the groove bottom 38 where the influence of the aspect ratio is heavy. Therefore, leakage of electromagnetic noise is restrained by the shield layer 16 on the upper side in the semiconductor package 10, whereas the shield layer 16 is thinned and generation of burs is restrained on the lower side in the semiconductor package 10.

The ground line 17 of the wiring board 11 is exposed to the exterior at the lower side of the inclined surfaces 25 of the package side surfaces 23. Since the shield layer 16 is formed in an appropriate thickness at the lower side of the inclined surfaces 25 and the shield layer 16 is connected to the ground line 17 there, electromagnetic noises generated in the semiconductor package 10 are released out of the semiconductor package 10 through the ground line 17. Note that although the shield layer 16 is thinned at the lower side of the vertical surfaces 26 of the package side surfaces 23, the electromagnetic noises have been cut by the multiplicity of wirings in the wiring board 11. Therefore, leakage of electromagnetic noises to electronic parts in the surroundings of the semiconductor package 10 is prevented as a whole.

Note that the shield layer 16 is a multilayer film having a thickness of several micrometers or more formed from at least one metal selected from among copper, titanium, nickel, gold and the like, and is formed by, for example, a sputtering method, an ion plating method, a spray coating method, a CVD method, an ink jet method, or a screen printing method. Besides, the shield layer 16 may be formed by vacuum lamination in which a metallic film having the above-mentioned multilayer film is adhered to the package upper surface 22 and the package side surfaces 23 in a vacuum atmosphere. In this way, a semiconductor package 10 in which the package upper surface 22 and the package side surfaces 23 are covered with the shield layer 16 is manufactured.

As depicted in FIG. 4D, a picking-up step is performed after the shield layer forming step is conducted. In the picking-up step, the semiconductor package 10 formed with the shield layer 16 is picked up by a picker (not depicted) or the like. In this case, deposition (build-up) of the shield layer 16 at the lower side of the vertical surfaces 26 of the package side surfaces 23 or on the groove bottom 38 between the packages is restrained, by the control of the aspect ratio between the packages. Therefore, at the time of picking up the semiconductor package 10, the shield layer 16 is not peeled off from the groove bottom 38 of the adhesive tape 35, and burs are not liable to be generated at package lower portions.

In this way, according to the method of manufacturing the semiconductor package 10 of the first embodiment), formation of the shield layer 16 at the lower surface side of the semiconductor package 10 is restrained by the control of the aspect ratio, whereby generation of burs upon picking-up of the semiconductor package can be restrained. Therefore, the need for a deburring operation is eliminated, so that processing quality and processing time can be improved. In addition, since the series of steps from the groove forming step to the picking-up step are carried out on the adhesive tape 35, it is unnecessary to transfer the semiconductor package 10 from the adhesive tape 35 to a tray or the like, so that the number of working steps can be reduced.

Figure 5A:
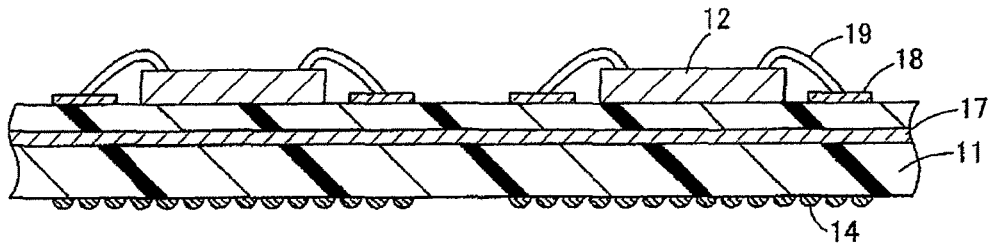
FIGS. 5A to 5C are schematic sectional views depicting a method of manufacturing a semiconductor package according to a second embodiment.
Figure 5B:
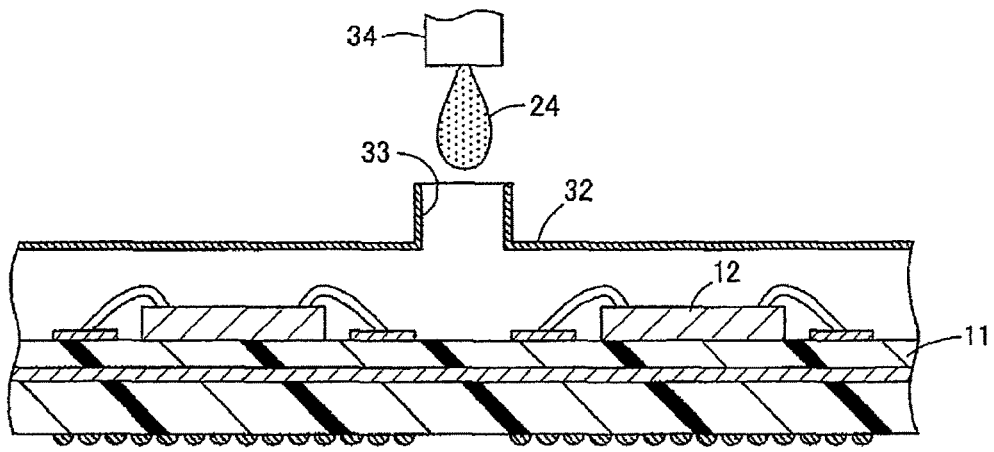
Figure 5C:
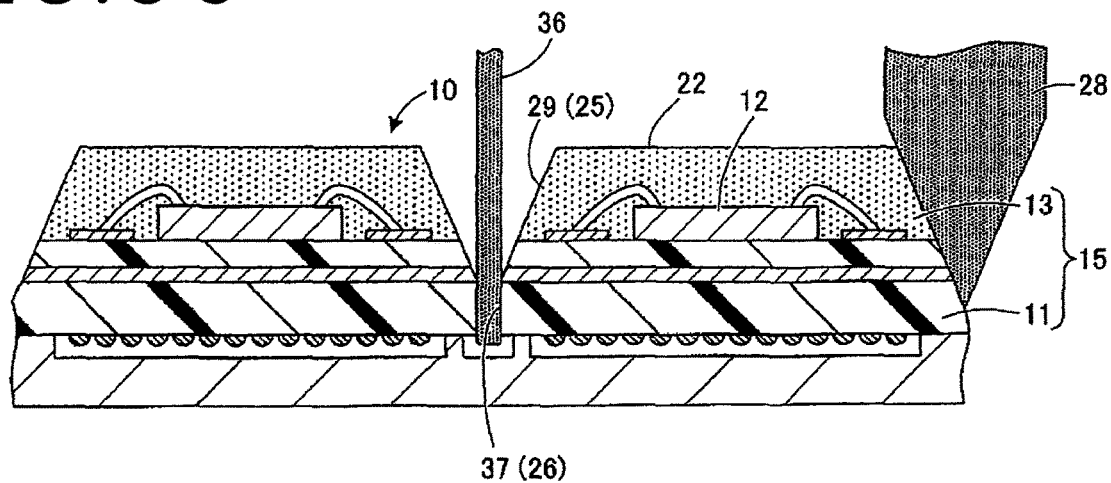
Figure 6A:
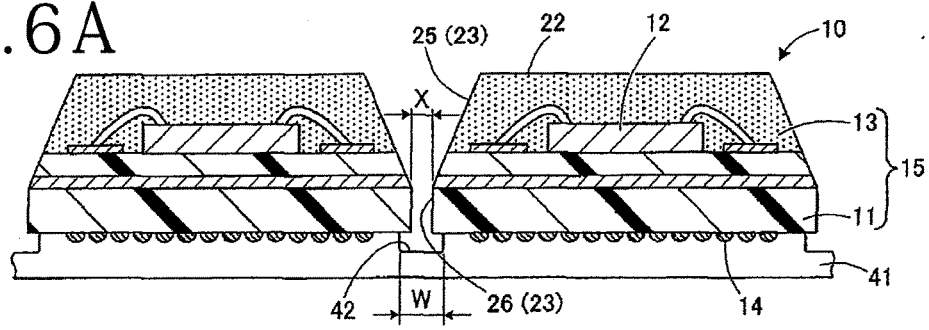
FIGS. 6A to 6D are schematic sectional views depicting the method of manufacturing a semiconductor package according to the second embodiment.
Figure 6B:
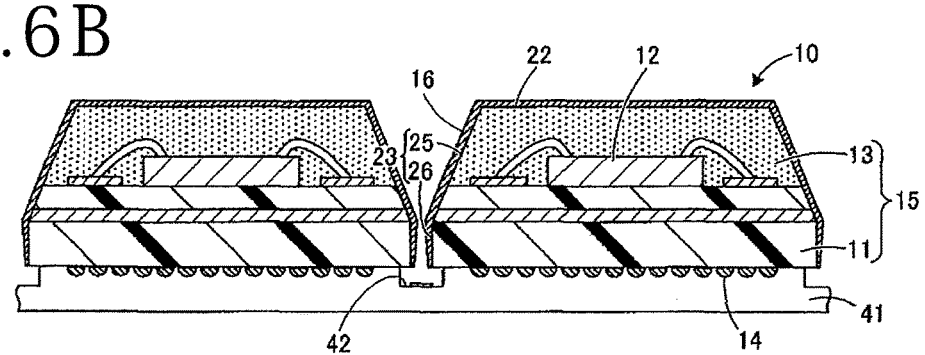
Figure 6C:
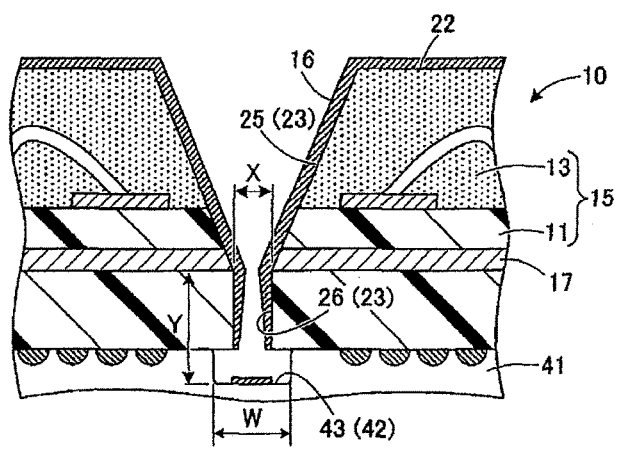
Figure 6D:
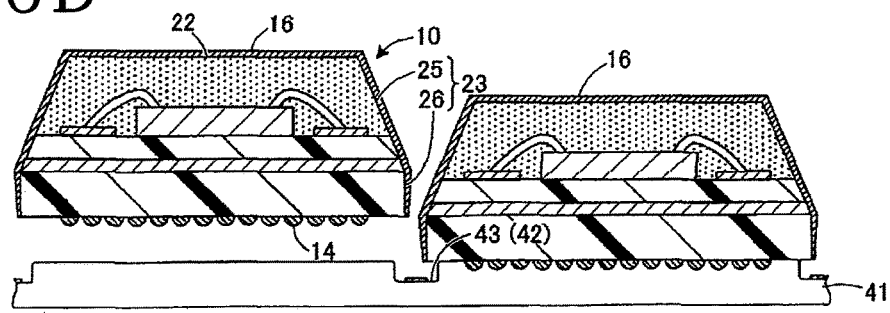

Referring to FIGS. 5A to 6D, a method of manufacturing a semiconductor package according to a second embodiment will be described below. The second embodiment differs from the first embodiment in that a shield layer is formed in a state in which semiconductor packages are aligned on a protective tape. Therefore, the same points of configuration as those in the method of manufacturing the semiconductor package according to the first embodiment will be described in a simplified manner. FIGS. 5A to 6D are figures for explaining the method of manufacturing a semiconductor package according to the second embodiment. FIG. 5A depicts an example of a mounting step, FIG. 5B depicts an example of a substrate producing step, FIG. 5C depicts an example of a dividing step, FIG. 6A depicts an example of a semiconductor package aligning step, FIGS. 6B and 6C depict an example of a shield layer forming step, and FIG. 6D depicts an example of a picking-up step.

As depicted in FIG. 5A, a mounting step is first performed. In the mounting step, a plurality of semiconductor chips 12 are mounted in a plurality of regions partitioned by division lines on a wiring board 11. The wiring board 11 is formed therein with wirings such as a ground line 17, and bumps 14 are disposed on a lower surface of the wiring board 11. Then, one end of a wire 19 is connected to an electrode on an upper surface of the semiconductor chip 12, and the other end of the wire 19 is connected to an electrode 18 on the surface of the wiring board 11. Note that the wire bonding is not restrictive, and flip chip bonding may be conducted in which electrodes on the lower surface of the semiconductor chip 12 are directly connected to electrodes on the surface of the wiring board 11.

As depicted in FIG. 5B, a substrate producing step is performed after the mounting step is conducted. In the substrate producing step, a sealant 24 is supplied onto the wiring board 11 on a holding jig (not depicted) from a supply nozzle 34 through an injection port 33 of a mold 32, and the plurality of semiconductor chips 12 on the wiring board 11 are sealed with the sealant 24. In this state, the sealant 24 is cured by .heating or drying, whereby a semiconductor package substrate 15 in which a resin layer 13 (see FIG. 5C) is formed on an upper surface of the wiring board 11 is produced. Note that a planarizing step of planarizing the resin layer 13 by grinding may be performed after the substrate producing step. In addition, in the case where the semiconductor package substrate 15 is preliminarily prepared, the mounting step and the substrate producing step may be omitted.

As depicted in FIG. 5C, a dividing step is performed after the substrate producing step is conducted. In the dividing step, in the same manner as in the groove forming step of the first embodiment, the resin layer 13 side is half cut by a V blade 28, whereby V grooves 29 are formed along division lines. Further, in the same manner as in the dividing step of the first embodiment, the wiring board 11 is fully cut by a cutting blade 36, whereby the semiconductor package substrate 15 is divided along the division lines into individual semiconductor packages 10. In this way, the semiconductor package substrate 15 is individualized by step cutting conducted using the V blade 28 and the cutting blade 36.

The semiconductor package substrate 15 is formed with the V grooves 29, and with narrow-width rectangular grooves 37 at groove bottoms of the V grooves 29. Therefore, package side surfaces 23 are formed with inclined surfaces 25 such that the outer shape size of package becomes larger than that at the package upper surface 22 on route from the package upper surface 22 toward the lower surface. In regard of the package side surfaces 23, the package interval is greater on the inclined surface 25 side, and is smaller on the vertical surface 26 side. Therefore, in a semiconductor package aligning step conducted at a later stage, the semiconductor packages 10 can be aligned in such a manner that the package interval is reduced on the lower side in the semiconductor packages 10.

As depicted in FIG. 6A, the semiconductor package aligning step is performed after the dividing step is conducted. In the semiconductor package aligning step, the divided semiconductor packages 10 are aligned on a protective tape 41 serving as a support member. In this case, a holding surface of the protective tape 41 is formed with shallow grooves (grooves) 42 in a grid pattern, and the holding surface is partitioned by the shallow grooves 42 into a plurality of regions. The semiconductor package 10 is placed in each of the regions, whereby the semiconductor packages 10 are aligned in a state in which the adjacent semiconductor packages 10 are spaced from each other by a predetermined interval of X mm. Since the groove width W mm of the shallow groove 42 is greater than the package interval X mm, the vertical surfaces 26 of the semiconductor package 10 protrude into the inside of the shallow groove 42. Note that the semiconductor packages 10 may be held on a holding jig, instead of the protective tape 41.

As depicted in FIG. 6B a shield layer forming step is performed after the semiconductor package aligning step. In the shield layer forming step, a shield layer 16 is formed on the package upper surfaces 22 and the package side surfaces 23 from a conductive material supplied from above the resin layer 13. In this instance, since inclined surfaces 25 of the package side surfaces 23 are inclined in such a manner as to expand outward in going downward from the package upper surface 22, the shield layer 16 is formed in a desired thickness not only on the package upper surfaces 22 but also on the inclined surfaces 25. Although the shied layer 16 is formed also on the vertical surfaces 26 of the package side surfaces 23 and on the groove bottoms 43 of the shallow grooves 42 of the protective tape 41, the thickness of the shield layer 16 there is controlled according to the aspect ratio between the packages on the package lower side.

More specifically, as depicted in FIG. 6C, the aspect ratio between the packages is represented by Y/X, where Y (mm) is the depth from the lower end of the inclined surface 25 to the groove bottom 43 of the shallow groove 42 of the protective tape 41 (the length of the side surface), and X (mm) is the opposing spacing between the vertical surfaces 26. The inclination of the inclined surface 25, the depth Y mm, the predetermined interval X mm, and the shield layer forming conditions are so set as to obtain such an aspect ratio that at the time of formation of the shield layer, the shield layer 16 is formed on the package side surfaces 23 but the thickness of the shield layer 16 formed on the groove bottom 43 between the packages is reduced. Note that for each of these conditions, experimentally, empirically or theoretically obtained values are set.

The control of the aspect ratio is carried out mainly by varying the opposing spacing X mm between the vertical surfaces 26 and the depth Y mm of the shallow grooves 42 of the protective tape 41 in aligning on the protective tape 41. With, the aspect ratio set to be high on the vertical surface 26 side, it is ensured that the shield layer 16 is formed in an appropriate thickness on the inclined surfaces 25 and on the upper side of the vertical surfaces 26 where the influence of the aspect ratio is slight, whereas the shield layer 16 is formed in a thin form at the lower side of the vertical surfaces 26 and on the groove bottoms 43 where the influence of the aspect ratio is heavy. Further, since the vertical surfaces 26 of the semiconductor package 10 protrude into the inside of the shallow groove 42, the shield layer 16 is separated between the vertical surface 26 and the shallow groove 42. Therefore, generation of burs upon picking-up of the semiconductor package 10 is restrained.

The ground line 17 of the wiring board 11 is exposed to the exterior at the lower side of the inclined surfaces 25 of the package side surfaces 23. Since the shield layer 16 is formed in an appropriate thickness at the lower side of the inclined surfaces 25 and the shield layer 16 is connected to the ground line 17, electromagnetic noises generated in the semiconductor package 10 are released out of the semiconductor package 10 through the ground line 17. Note that the shield layer 16 is thinned at the lower side of the vertical surfaces 26 of the semiconductor package 10, the electromagnetic noises are cut by the multiplicity of wirings in the wiring board 11. Therefore, leakage of electromagnetic noises to electronic parts in the surroundings of the semiconductor package 10 is prevented as a whole.

Note that, the shield layer 16 is a multilayer film having a thickness of several micrometers or more formed from at least one metal selected from among copper, titanium, nickel, gold and the like, and is formed by, for example, a sputtering method, an ion plating method, a spray coating method, a CVD method, an ink jet method, or a screen printing method. Besides, the shield layer 16 may be formed by vacuum lamination in which a metallic film having the above-mentioned multilayer film is adhered to the package upper surface 22 and the package side surfaces 23 in a vacuum atmosphere. In this way, a semiconductor package 10 in which the package upper surface 22 and the package side surfaces 23 are covered with the shield layer 16 is manufactured.

As depicted in FIG. 6D, a picking-up step is performed after the shield layer forming step is conducted. In the picking-up step, the semiconductor package 10 formed with the shield layer 16 is picked up by a picker (not depicted) or the like. In this case, by the control of the aspect ratio between the packages, deposition (build-up) of the shield layer 16 at the lower side of the vertical surfaces 26 of the package side surfaces 23 or on the groove bottoms 43 between the packages has been restrained. Further, since the shield layer 16 is separated between the vertical surface 26 and the shallow groove 42, the shield layer 16 is left in the shallow groove 42 and generation of burs is restrained at the time of picking-up of the semiconductor package 10.

In this way, according to the method of manufacturing the semiconductor package 10 of the second embodiment, like in the first embodiment, formation of the shield layer 16 at the lower side of the semiconductor package 10 is restrained by the control of the aspect ratio, whereby generation of burs upon picking-up of the semiconductor package can be restrained. Therefore, the need for a deburring operation is eliminated, so that processing quality and processing time can be improved.

Note that the side surface shape of the semiconductor package in the first and second embodiments is not limited to that in the above configuration. The side surface shape of the semiconductor package may be any one such that the package interval between the adjacent semiconductor packages becomes smaller on route from the upper surface toward the lower surface of the semiconductor package. Side surface shapes of semiconductor packages according to modifications will be described below. FIGS. 7A to 7E depict an example of variation of the side surface shape of the semiconductor package.

Figure 7A:
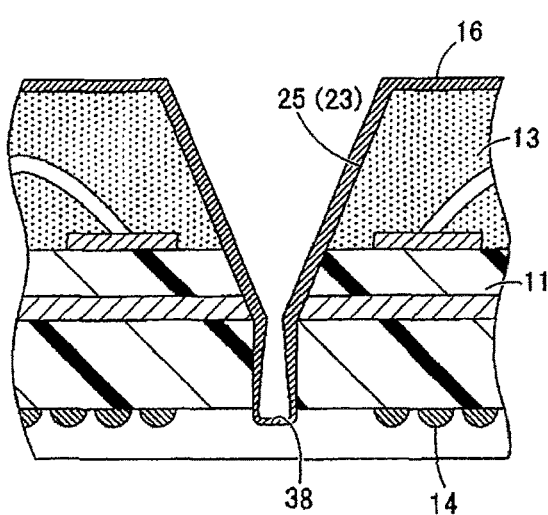
FIGS. 7A to 7E are schematic sectional views depicting an example of variation of side surface shape of the semiconductor package.

As depicted in FIG. 7A, in the semiconductor packages of the first and second embodiments, a configuration has been adopted in which the package side, surface 23 is formed with the inclined surface 25 over the range of the resin layer 13 and the wiring board 11, but this configuration is not limitative. For example, as depicted in FIG. 7B, a configuration may be adopted in which the inclined surface 25 is formed only in the resin layer 13. In this case, only the resin layer 13 where the consumption of a blade is comparatively slight is cut by the V blade, whereby consumption of the V blade can be restrained and blade life can be prolonged.

Variation in shape due to consumption of the V blade is restrained, whereby angle management in regard of the V groove can be facilitated.

Figure 7D:
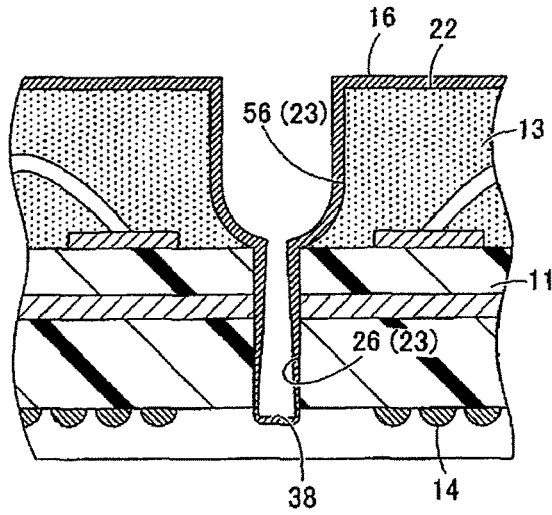
Figure 7B:
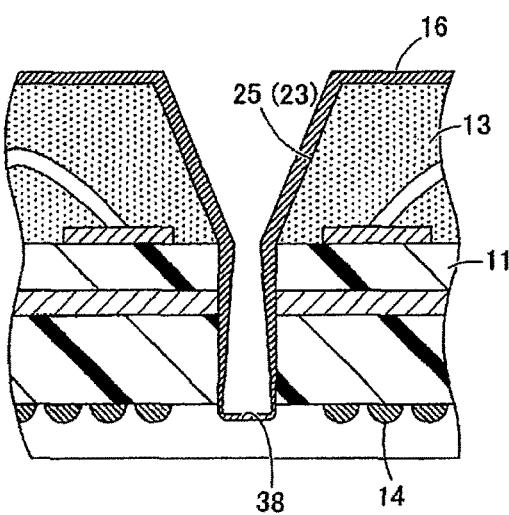
Figure 7E:
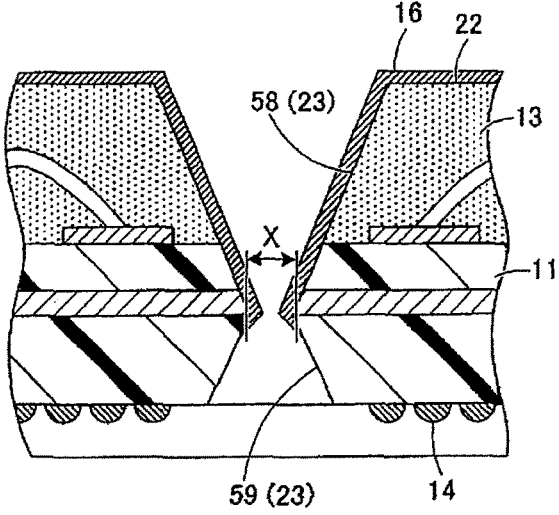
Figure 7C:
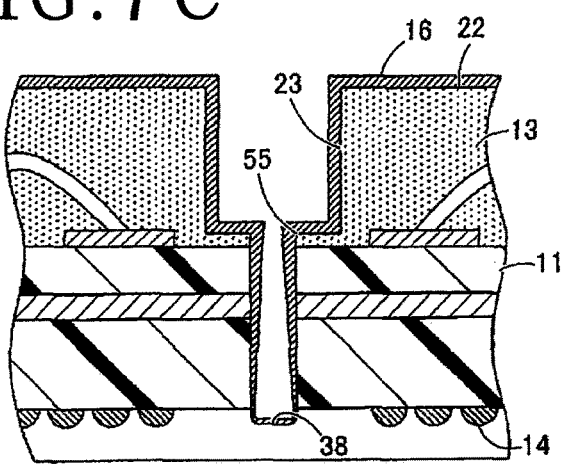

In addition, as depicted in FIG. 7C, a configuration may be adopted in which the package side surface 23 is formed with a step 55 such that the outer shape size of the package becomes larger than that at the package upper surface 22 on route from the package upper surface 22 toward the lower surface. In this case, the step 55 is formed in the package side surface 23, by step cutting conducted using a large-width cutting blade and a small-width cutting blade. With a large package interval secured on the upper-stage side of the package side surface 23, the shield layer 16 is formed in an appropriate thickness at the upper-stage side of the package side surface 23. In addition, the aspect ratio between the packages is controlled at the lower-stage side of the package side surface 23, whereby the shield layer 16 on the groove bottom 38 between the packages can be formed in a thinned form and generation of burrs can be restrained.

Besides, as depicted in FIG. 7D, a configuration may be adopted in which the package side surface 23 is formed with a curved surface 56 such that the outer shape size of the package becomes larger than that at the package upper surface 22 on route from the package upper surface 22 toward the lower surface. In this case, the curved surface 56 and a vertical surface 26 are formed in the package side surface 23, by step cutting conducted using a large-width curved blade and a small-width cutting blade. Since the curved surface 56 intersects the forming direction (vertical direction) of the shield layer 16, the shield layer 16 can be formed in an appropriate thickness on the curved surface 56. In addition, the aspect ratio between the packages is controlled at the vertical surface 26 side of the semiconductor package 10, whereby the shield layer 16 on the groove bottom 38 between the packages can be formed in a thinned form and generation of burrs can be restrained.

Figure 8:
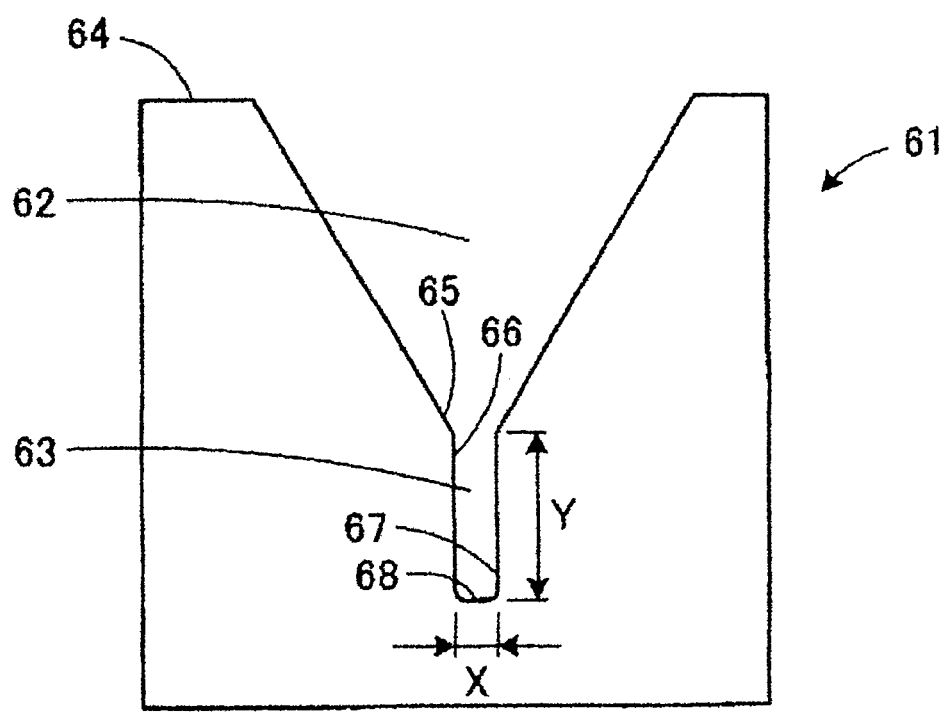
FIG. 8 is a schematic sectional view of a specimen.

Further, as depicted in FIG. 7E, a configuration may be adopted in which the package side surface 23 is formed with inclined surfaces 58 and 59 such that the outer shape size of the package is maximized on route from the package upper surface 22 toward the lower surface. In this case, cutting is conducted by a V blade from the upper side and the lower side, whereby the inclined surfaces 58 and 59 are formed in the package side surface 23. The package interval at the boundary position between the inclined surfaces 58 and 59 is made to be X mm, and the aspect ratio between the packages on the lower side of the boundary position is controlled, whereby the shield layer 16 can be formed in a thinned form at the lower side of the semiconductor package and generation of burs upon picking-up can be restrained. Now, the relation between step coverage of the semiconductor package and the aspect ratio will be described below. FIG. 8 is a sectional schematic view of a specimen. FIGS. 9A to 9D are diagrams depicting the relation between step coverage and aspect ratio, for specimens.

As depicted in FIG. 8, on each of four kinds of specimens 61 each formed with a V groove 62 and a rectangular groove 63, a shield layer was formed by an ion plating method under the conditions of 180° C. and $8 \times 10^{-4}$ Pa. As the four kinds of specimens 61, there were prepared specimens 61 formed with rectangular grooves 63 having respective aspect ratios Y/X of 1, 2, 3 and 4, where X (mm) is the groove width and Y (mm) is the groove depth. For each of the specimens 61, the thickness of the shield layer on the upper surface 64, the thickness of the shield layer at a V groove lower portion 65, the thickness of the shield layer at a rectangular groove upper portion 66, the thickness of the shield layer at a rectangular groove lower portion 67, and the thickness of the shield layer on the groove bottom 68 were measured based on images observed under an electron microscope.

Then, with the thickness of the shield layer on the upper surface 64 of the specimen 61 as a reference, step coverages of the thickness of the shield layer at the V groove lower portion 65, the rectangular groove upper portion 66, the rectangular groove lower portion 67, and the groove bottom 68 were summarized in FIGS. 9A to 9D. Note that the step coverage at each of specific portions, namely, the V groove lower portion 65, the rectangular groove upper portion 66, the rectangular groove lower portion 67 and the groove bottom 68 is calculated from the thickness of the shield layer at the specific portion and the thickness of the shield layer on the upper surface from the following formula (1). In addition, the aspect ratio is calculated from the width and the depth of the rectangular groove 63 from the following formula (2).

Step coverage=((Thickness at specific portion)/(Thickness on upper surface))×100[%]　　Formula (1)

Aspect ratio=(Depth of rectangular groove)/(Width of rectangular groove)　　Formula (2)

Figure 9A:
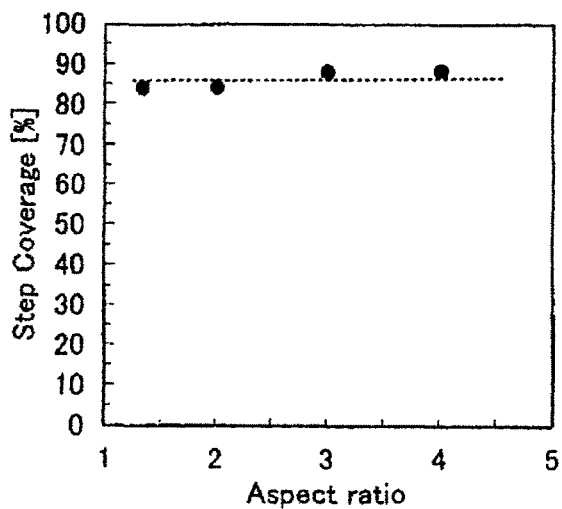
FIGS. 9A to 9D are diagrams: depicting the relation between step coverage and aspect ratio of the specimen.

As depicted in FIG. 9A, the step coverage at the V groove lower portion 65 in relation to the upper surface 64 of the specimen 61 was maintained at approximately 90%, irrespectively of variations in the aspect ratio of the rectangular groove 63. In addition, as depicted in FIG. 9B, the step coverage at the rectangular groove upper portion 66 in relation to the upper surface 64 of the specimen 61 was maintained at approximately 60%, irrespectively of variations in the aspect ratio of the rectangular groove 63. Therefore, the thicknesses of the shield layer at the V groove lower portion 65 and the rectangular groove upper portion 66 were found to be independent from the aspect ratio of the rectangular groove 63. For this reason, even when the aspect ratio of the rectangular groove 63 is raised, a step coverage of approximately 90% is obtained at the V groove 62, whereby a shielding property is enhanced, and a step coverage of approximately 60% is obtained at the rectangular groove upper portion 66, whereby grounding to the ground line in the wiring board can be realized.

Figure 9C:
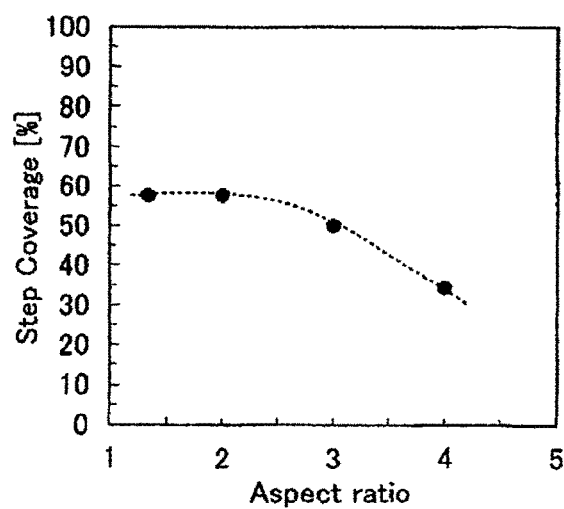
Figure 9B:
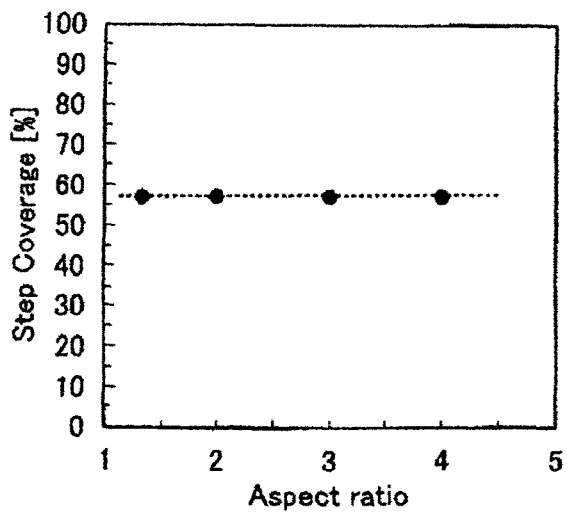
Figure 9D:
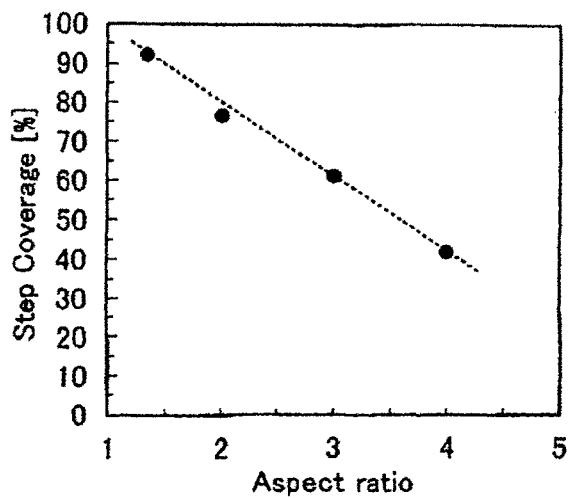

As depicted in FIG. 9C, the step coverage at the rectangular groove lower portion 67 in relation to the upper surface 64 for the specimen 61 was maintained at approximately 60% when the aspect ratio of the rectangular groove 63 was not more than 2, but the step coverage was lowered to approximately 35% when the aspect ratio was increased to 4. As depicted in FIG. 9D, the step coverage at the groove bottom 68 in relation to the upper surface 64 of the specimen 61 was decreased with an increase in the aspect ratio of the rectangular groove 63, and the step coverage was lowered to approximately 40% when the aspect ratio was increased to 4. Therefore, the thicknesses of the shield layer at the rectangular groove lower portion 67 and the groove bottom 68 were found to be heavily dependent on the aspect ratio of the rectangular groove 63. For this reason, with the aspect ratio of the rectangular groove 63 raised, the step coverages at the rectangular groove lower portion 67 and the groove bottom 68 can be reduced, and generation of burs can be restrained. In this way, by controlling the ratio of the V groove 62 and the rectangular groove 63, it is possible to realize both enhancement of a shielding property and restraining of bur generation.

Figure 10A:
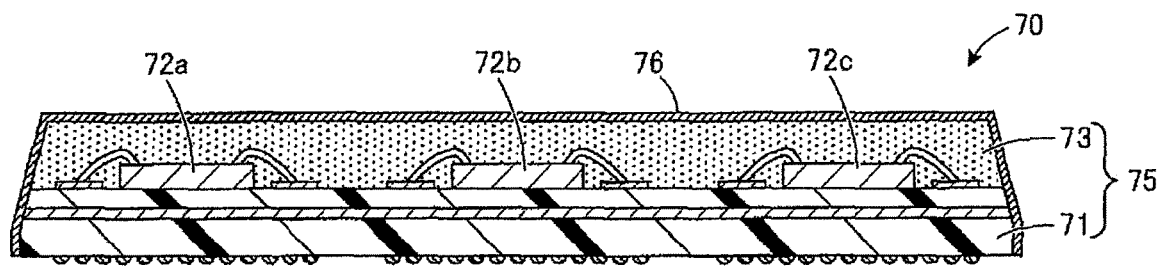
FIGS. 10A and 10B are schematic sectional views depicting modifications of the semiconductor package.

Note that while a semiconductor package in which one semiconductor chip is mounted on a wiring board has been described as an example in the first and second embodiments, this configuration is not restrictive. A semiconductor package in which a plurality of semiconductor chips are mounted on a wiring board may be manufactured. For example, as depicted in FIG. 10A, a semiconductor package 70 may be manufactured by mounting a plurality (for example, three) of semiconductor chips 72a to 72c on a wiring board 71 and shielding the semiconductor chips 72a to 72c collectively. In this case, a semiconductor package substrate 75 is formed with V grooves on a package basis, and the semiconductor package substrate 75 is divided on a package basis. Note that the semiconductor chips 72a to 72c may have the same function or may have different functions.

Figure 10B:
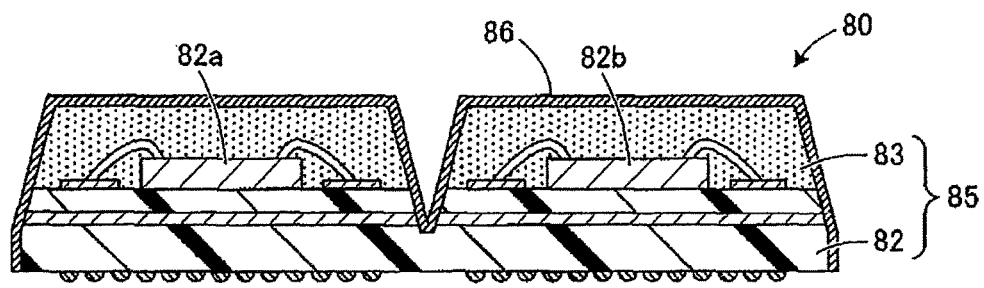

In addition, as depicted in FIG. 10B, a semiconductor package (SIP) 80 in which a plurality (for example, two) of semiconductor chips 82a and 82b are mounted on a wiring board 82 and the semiconductor chips 82a and 82b are individually shielded may be manufactured. In this case, a semiconductor package substrate 80 is formed with V grooves on a chip basis, and the semiconductor package substrate is divided on a package basis. By this, a shield layer 86 is formed between the semiconductor chips 82a and 82b, whereby influences of electromagnetic noises between the semiconductor chips 82a and 82b can be prevented. Note that the semiconductor chips 82a and 82b may have the same function or may have different functions.

Figure 11A:
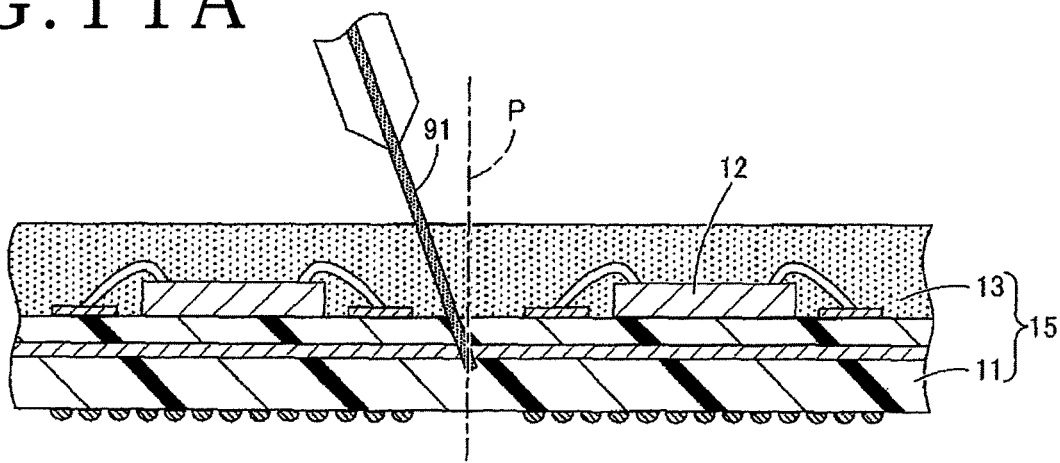
FIGS. 11A to 11C are schematic sectional views depicting a modification of formation of a groove in a semiconductor package substrate.

Besides, while the V grooves have been formed by use of the V blade as a processing tool in the above-described first and second embodiments, this configuration is not limitative. For example, as depicted in FIG. 11A, V grooves may be formed in a semiconductor package substrate 15 by use of an ordinary cutting blade 91 as a processing tool. In this case, cutting is conducted with the cutting blade 91 inclined at a predetermined angle to one side relative to a vertical plane P on a division line of the semiconductor package substrate 15, after which cutting is conducted with the cutting blade 91 inclined at the predetermined angle to the other side relative to the vertical plane P. By this, an upper surface of the semiconductor package substrate 15 is cut away in a V shape by the cutting blade 91, and the V groove is formed along the division line.

Figure 11B:
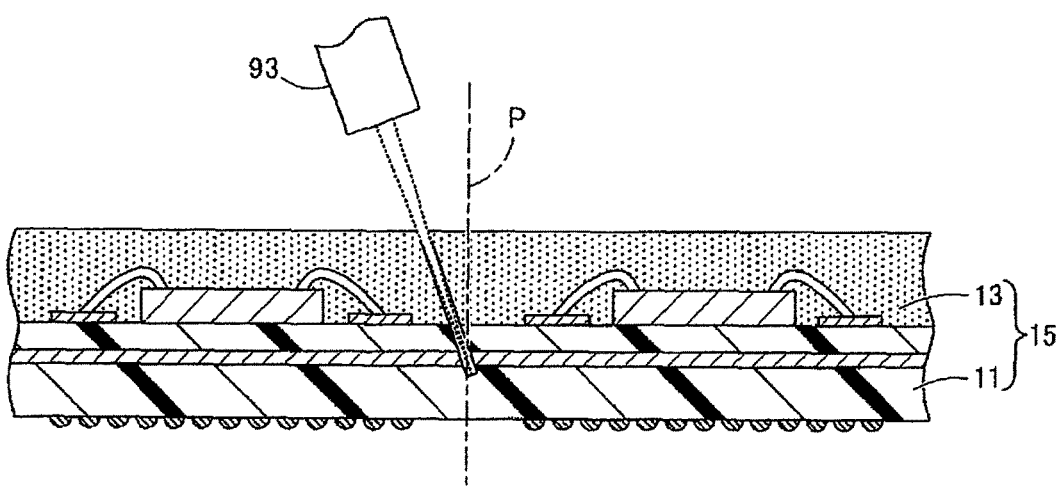

In addition, as depicted in FIG. 11B, V grooves may be formed in a semiconductor package substrate 15 by use of a processing head 93 for laser ablation as a processing tool. In this case, ablation processing is conducted with the processing head 93 inclined at a predetermined angle to one side relative to a vertical plane P on a division line of the semiconductor package substrate 15, after which ablation processing is conducted with the processing head 93 inclined at the predetermined angle to the other side relative to the vertical plane P. An upper surface of the semiconductor package substrate 15 is cut away in a V shape by a laser beam such as to be absorbed in the semiconductor package substrate 15, and the V groove is formed along the division line. Note that laser ablation refers to a phenomenon in which when the irradiation intensity of a laser beam reaches or exceeds a predetermined processing threshold, the laser beam is converted into electronic, thermal, optical and kinetic energy at the surface of a solid, with the result that neutral atoms, molecules, positive or negative ions, radicals, clusters, electrons and/or light is released in an explosive manner, whereby the surface of the solid is etched.

Figure 11C:
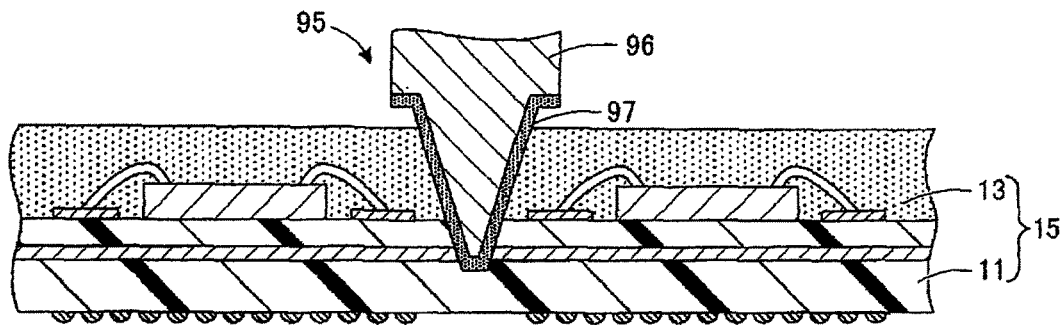

Besides, as depicted in FIG. 11C, V grooves may be formed in a semiconductor package substrate 15 by use of a profiler 95 as a processing tool. The profiler 35 is configured by electrodeposition of an abrasive grain layer 97 of diamond abrasive grains on a substantially V-shaped processing surface of an aluminum base member 96. The profiler 95 is less susceptible to consumption and can retain the V shape for a long time, as compared to a V blade. In addition, in the cases of manufacturing the semiconductor packages depicted in FIGS. 7B to 7E, also, the processing head for laser processing or the profiler may be used as a processing tool, at the time of forming grooves in a package substrate or dividing the package substrate.

Figure 12:
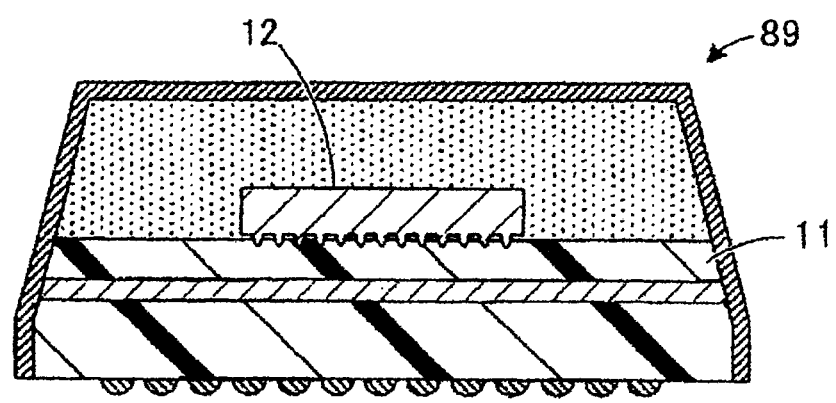
FIG. 12 is a schematic sectional view depicting a modification of the semiconductor package.

In addition, while a configuration for manufacturing a semiconductor, package in which a semiconductor chip or chips are wire bonded to electrodes of a wiring board through wires has been described in the first and second embodiments and modifications above, this configuration is not restrictive. As depicted in FIG. 12, a semiconductor package 89 may adopt flip chip bonding in which a semiconductor chip 12 is directly connected to electrodes of a wiring board 11.

Besides, in the first and second embodiments, the formation of V grooves, in the semiconductor package substrate and the division of the semiconductor package substrate may be carried out by use of the same apparatus or may be performed by use of different apparatuses.

In addition, while the division of the semiconductor package substrate has been conducted using a cutting blade in the first and second embodiments described above, this configuration is not limitative. The division of the semiconductor package substrate need only be division of the semiconductor package substrate into individual semiconductor packages; for example, the semiconductor package substrate may be divided into individual semiconductor packages by ablation processing.

Besides, while the groove forming step has been cutting in to an intermediate position of thickness of the wiring board by a processing tool in the first embodiment above, this configuration is not restrictive. The groove forming step need only be cutting in at least to an intermediate position of thickness of the resin layer by a processing tool.

In addition, while the adhesive tape has been mentioned as an example of the support member in the first embodiment above, this configuration is not limitative. The support member need only be a member that supports the semiconductor package substrate, and may be composed of a substrate, for example. Therefore, in the adhering step, a configuration in which the wiring board side of the semiconductor package substrate is adhered to the adhesive tape attached to the ring frame is not restrictive, and a configuration may be adopted in which the wiring board side of the semiconductor package substrate is adhered to a substrate through an adhesive layer.

Besides, while the semiconductor package aligning step has consisted in aligning the semiconductor packages on the protective tape or holding jig formed with the shallow grooves in the second embodiment above, this configuration is not limitative. The semiconductor package aligning step may consist in aligning the semiconductor packages on a flat protective tape or holding jig that is not formed with shallow grooves. In this case, the aspect ratio between the packages is controlled according to the depth from the inclination or step of the semiconductor package to the holding surface of the protective tape or holding jig.

In addition, while the protective tape has been mentioned as an example of the support member in the second embodiment above, this configuration is not restrictive. The support member need only be a member that supports the semiconductor packages through an adhesive layer, and may be composed of a substrate, for example. This substrate may or may not be formed with shallow grooves. In the semiconductor package aligning step, a configuration in which the semiconductor packages are aligned on a protective tape or holding jig is not limitative, and the semiconductor packages may be aligned on a substrate in the state of being fixed with a wax.

Besides, a configuration in which the semiconductor package is used for portable communication apparatuses such as mobile phones is not restrictive, and the semiconductor package may be used for such electronic apparatuses as cameras. In addition, while the embodiments and modifications have been described above, other embodiments of the present invention include those obtained by combining, entirely or partly, the above embodiments and/or modifications.

Besides, the embodiment of the present invention is not limited to the above-described embodiments and modifications, and various changes, replacements and modifications may be made without departing from the gist of the technical thought of the invention. Furthermore, if the technical thought of the present invention can be realized in a different manner, owing to the progress of technology or by other derived technology, the present invention may be carried out by the different method.

Accordingly, the claims cover all the embodiments which can fall within the scope of the technical thought of the present invention.

In addition, while a configuration in which the present invention is applied to a method of manufacturing a semiconductor package has been described in the above embodiments, the invention is applicable also to a method of manufacturing other package parts in which a shield layer having a predetermined film thickness is formed.

As has been described above, the present invention has an effect to make it possible to restrain generation of burs upon picking-up of the semiconductor package, and is particularly useful as a method of manufacturing a semiconductor package for use in portable communication apparatuses.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a semiconductor package, the semiconductor package obtained by dividing a semiconductor package substrate having a plurality of semiconductor chips which are mounted in a plurality of regions on a wiring board partitioned by a plurality of intersecting division lines and which are sealed with a sealant, the semiconductor package substrate being divided along the division lines, the method comprising:
    an adhering step of adhering a wiring board side of the semiconductor package substrate onto a support member having an adhesive layer;
    a groove forming step of cutting in from a sealant side to at least an intermediate position in the sealant along the division lines by a processing tool, to form grooves having a first width at least at an upper surface of the sealant and inclined surfaces on a portion of opposing sides of the semiconductor package substrate, after the adhering step is conducted;
    a dividing step of cutting in from the sealant side to an intermediate position in the support member along the grooves by use of a cutting blade having a second width smaller than the first width, to divide the semiconductor package substrate such that the adjacent semiconductor packages are spaced by a predetermined interval X mm from each other, after the groove forming step is conducted;
    a shield layer forming step of forming a shield layer on the inclined surfaces of the opposing sides of the semiconductor packages and an upper surface of the sealant from a conductive material supplied from above the sealant, after the dividing step is conducted; and
    a picking-up step of picking up the semiconductor package formed with the shield layer, after the shield layer forming step is conducted,
    wherein the first width and the second width are set so that an inclination is generated in each of the side surfaces in such a manner that outer shape size of the semiconductor package becomes larger than an upper surface of the sealant of each of the divided semiconductor packages on route from the upper surface toward the lower surface of the sealant, and
    where the side surface length from a lower end of the inclination of the semiconductor package to a groove bottom of the cut into the support member is Y mm, and the first width, the second width, the side surface length Y mm, and shield layer forming conditions are set to obtain an aspect ratio Y/X that at the time of formation of the shield layer, the shield layer is formed on the side surfaces but the amount of the shield layer formed on the groove bottom between the semiconductor packages is reduced.

2. A method of manufacturing a semiconductor package, the semiconductor package obtained by dividing a semiconductor package substrate having a plurality of semiconductor chips which are mounted in a plurality of regions on a wiring board partitioned by a plurality of intersecting division lines and which are sealed with a sealant, the semiconductor package substrate being divided along the division lines, the method comprising:
    a dividing step of dividing the semiconductor package substrate along the division lines, and forming each side surface of each semiconductor package with an inclination or step such that outer shape size of the semiconductor package becomes larger than that at an upper surface of the sealant of the semiconductor package on route from the upper surface toward a lower surface of the sealant;
    a semiconductor package aligning step of aligning the divided individual semiconductor packages in such a manner that the adjacent semiconductor packages are spaced by a predetermined interval X mm from each other, and holding a wiring board side of the aligned semiconductor packages on a holding jig or adhering the wiring board side onto a support member,
    wherein in the semiconductor package aligning step, the semiconductor packages are placed in regions formed by partitioning a holding surface of the holding jig or the support member by grooves provided in a grid pattern, and are aligned such that the adjacent semiconductor packages are spaced by the predetermined interval X mm from each other, and the groove width of the grooves is larger than the predetermined interval X mm between the semiconductor packages;
    a shield layer forming step of forming a shield layer on side surfaces of the semiconductor packages and an upper surface of the sealant from a conductive material supplied from above the sealant; and
    a picking-up step of picking up the semiconductor package formed with the shield layer, after the shield layer forming step is conducted, wherein where side surface length from a lower end of the inclination or step of the semiconductor package to the holding jig or the support member is Y mm, then the inclination or step, the side surface length Y mm, the predetermined interval X mm, and the shield layer forming conditions are so set as to obtain such an aspect ratio Y/X that at the time of formation of the shield layer, the shield layer is formed on the side surfaces but the amount of the shield layer formed on a bottom surface between the semiconductor packages is reduced.

3. The method of manufacturing the semiconductor package according to claim 1, wherein the groove forming step includes cutting a v-shaped groove from a sealant side to at least an intermediate position in the sealant along the division lines by a processing tool.

4. The method of manufacturing the semiconductor package according to claim 3, wherein the dividing step is performed after the groove forming step and includes cutting a rectangular groove from the intermediate positon in the sealant to a bottom end of the substrate along the division lines, and forming vertical surfaces on the opposing side surfaces, wherein the vertical surfaces contact the inclined surfaces.

5. Thee method of manufacturing the semiconductor package according to claim 4, wherein the shield layer forming step includes forming a shield layer on the inclined surfaces and the vertical surfaces of the semiconductor packages and an upper surface of the sealant from a conductive material supplied from above the sealant, wherein a thickness of the shield layer on the inclined surfaces is greater than a thickness of the shield layer on the vertical surfaces.

6. The method of manufacturing the semiconductor package according to claim 1, further comprising forming bumps on a bottom surface of the semiconductor package substrate.

7. The method of manufacturing the semiconductor package according to claim 2, wherein the groove forming step includes cutting a v-shaped groove from a sealant side to at least an intermediate position in the sealant along the division lines by a processing tool to form the inclined surface on a portion of each side surface of each semiconductor package.

8. The method of manufacturing the semiconductor package according to claim 7, wherein the dividing step is performed after the groove forming step and includes cutting a rectangular groove from the intermediate positon in the sealant to a bottom end of the substrate along the division lines, and forming vertical surfaces on the opposing side surfaces, wherein the vertical surfaces contact the inclined surfaces.

9. Thee method of manufacturing the semiconductor package according to claim 8, wherein the shield layer forming step includes forming a shield layer on the inclined surfaces and the vertical surfaces of the semiconductor packages and an upper surface of the sealant from a conductive material supplied from above the sealant, wherein a thickness of the shield layer on the inclined surfaces is greater than a thickness of the shield layer on the vertical surfaces.

10. The method of manufacturing the semiconductor package according to claim 2, further comprising forming bumps on a bottom surface of the semiconductor package.

* * * * *